(12) United States Patent
Laermer et al.

(10) Patent No.: US 7,166,536 B1
(45) Date of Patent: Jan. 23, 2007

(54) METHODS FOR PLASMA ETCHING OF SILICON

(75) Inventors: Franz Laermer, Stuttgart (DE); Andrea Schilp, Schwaebisch Gmuend (DE); Bernhard Elsner, Kornstwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/720,761

(22) PCT Filed: Mar. 16, 2000

(86) PCT No.: PCT/DE00/00821

§ 371 (c)(1),
(2), (4) Date: Mar. 26, 2001

(87) PCT Pub. No.: WO00/67307

PCT Pub. Date: Nov. 9, 2000

(30) Foreign Application Priority Data

Apr. 29, 1999 (DE) ................................ 199 19 469

(51) Int. Cl.
H01L 21/302 (2006.01)
(52) U.S. Cl. ...................................... 438/719; 438/706
(58) Field of Classification Search ................ 438/706, 438/710, 712, 714, 719
See application file for complete search history.

(56) References Cited

U.S. PATENT DOCUMENTS

| | | | |
|---|---|---|---|
| 4,726,879 A | | 2/1988 | Bondur et al. |
| 4,795,529 A | * | 1/1989 | Kawasaki et al. ............ 216/37 |
| 4,855,017 A | | 8/1989 | Douglas |
| 5,047,115 A | * | 9/1991 | Charlet et al. ................ 216/64 |
| 5,110,408 A | * | 5/1992 | Fujii et al. .................... 216/75 |
| 5,182,234 A | * | 1/1993 | Meyer ........................ 438/695 |
| 5,302,536 A | * | 4/1994 | Josquin ....................... 438/595 |
| 5,389,570 A | * | 2/1995 | Shiozawa ................... 438/243 |
| 5,458,734 A | | 10/1995 | Tsukamoto |
| 5,498,312 A | | 3/1996 | Laermer et al. |
| 5,843,847 A | * | 12/1998 | Pu et al. ..................... 438/723 |
| 5,861,343 A | * | 1/1999 | Tseng ......................... 438/666 |
| 6,187,666 B1 | * | 2/2001 | Singh et al. ................ 438/633 |

FOREIGN PATENT DOCUMENTS

| | | |
|---|---|---|
| DE | 42 41 045 | 5/1994 |
| DE | 43 17 623 | 12/1994 |
| DE | 197 06 682 | 8/1998 |
| EP | 0 200 951 | 11/1986 |
| EP | 0 414 372 | 2/1991 |
| EP | 0414 372 A2 * | 2/1991 |
| JP | 08 134 651 | 5/1996 |

OTHER PUBLICATIONS

Flamm, D. et al. "Multiple-Etchant Loading Effets and Silicon Etching in CIF3 and Related Mixtures" Journal of The Electrochemical Society, Dec. 1982, USA, Bd. 129, Nr. 12, pp. 2755-2760.*

Flamm, D. et al.: "Multipel-Etchant Loading Effects And Silicon Etching In CIF/sub 3/ And Related Mixtures" Journal of The Electrochemical Society, Dec. 1982, USA, Bd. 129, Nr. 12, pp. 2755-5760.

Patent Abstracts of Japan, vol. 1996, No. 09 (Sep. 30, 1996).

* cited by examiner

Primary Examiner—Kin-Chan Chen
(74) Attorney, Agent, or Firm—Kenyon & Kenyon LLP

(57) ABSTRACT

A method of plasma etching, in particular of anisotropic plasma etching, of laterally defined structures in a silicon substrate, using a process gas, includes having at least one passivating material precipitated on the side walls of the laterally defined structures at least from time to time prior to and/or during etching. In an exemplary method, at least one of the compounds selected from the group $ClF_3$, $BrF_3$, or $IF_5$ is added to the process gas as a fluorine-delivering etching gas. In another exemplary method, $NF_3$ is added to the process gas, at least from time to time, as an additive consuming the passivating material. Finally, in another exemplary method, a light and easily ionizable gas, in particular $H_2$, He, or Ne, is added, at least from time to time, to the process gas. The three exemplary methods may be combined.

4 Claims, No Drawings

METHODS FOR PLASMA ETCHING OF SILICON

FIELD OF THE INVENTION

The present invention relates to a method of plasma etching, in particular of anisotropic plasma etching, of silicon according to the definition of the species of the independent claims.

BACKGROUND INFORMATION

In German Published Patent Application No. 197 06 682 is discussed a method of anisotropic high-rate plasma etching of silicon with $SiO_2$, formed from the addition of $SiF_4$ and $O_2$ to the actual $SF_6$ etching agent, being used as a side wall passivating material. At the same time, $CHF_3$, $CF_4$, $C_2F_6$, or $C_4F_8$ are added to the etching gas continuously or at determined intervals as $SiO_2$-consuming additives ("scavengers") in order to selectively strip the $SiO_2$ on the structure base.

Another high-rate etching method for silicon is discussed, for example, in German Patent No. 42 41 045, where a high-density plasma source using inductive high-frequency excitation (ICP source) or a special microwave excitation (PIE source) is used for releasing fluorine radicals from a fluorine-delivering etching gas and for releasing $(CF_2)_x$ radicals from a passivating gas that delivers teflon-forming monomers, to form a teflon-type passivating material, with etching gas and passivating gas being used alternately.

In German Published Patent Application No. 43 17 623, it is known that a mixture of $SF_6$ or another fluorine-delivering etching gas and $CHF_3$ or another passivating gas forming teflon-type monomers can be exposed to a high-density plasma, so that the fluorine radicals etch the silicon structure base and at the same time the teflon-type monomers form a passivating material on the structure side walls thus ensuring an anisotropic character of the etching process.

SUMMARY OF THE INVENTION

An object of an exemplary embodiment of the present invention is to improve existing plasma etching methods for silicon so that higher etching rates, lower profile deviations in etching, and better environmental compatibility of the process gas are ensured by using novel process gases.

The exemplary method according to the present invention is believed to have the advantage over the related art that it allows improved profile control and higher etching rates in the plasma etching process of silicon, in particular, in an anisotropic high-rate plasma etching process. At the same time, the process gases used are considerably more environmentally compatible than the process gases or additives used previously with respect to the greenhouse effect, and are therefore also available long-term.

Furthermore, when using fluorine-delivering etching gases $ClF_3$, $BrF_3$ or $IF_5$, large amounts of fluorine are released even at a relatively low plasma excitation, so that they are very efficient with regard to the excitation and the high silicon etching rates achieved, while not requiring that the plasma source such as an inductive plasma source or a microwave plasma source deliver a high power. Furthermore, it is advantageous that, in particular, $ClF_3$ when it decomposes to form $ClF$ or $BrF_3$ when it decomposes to form $BrF$ releases lighter and a larger number of fluorine radicals than the known $SF_6$ via its preferential decomposition reaction resulting in $SF_4$. In addition, the reaction on decomposition of $ClF_3$ to $ClF$ and $2F^*$ and of $BrF_3$ to $BrF$ and $2F^*$ requires a much lower activation energy than the reaction of $SF_6$ to $SF_4$ and $2F^*$. Thus, advantageously also fewer interference effects, capable of negatively affecting the etching profiles obtained, occur in the plasma source due to the lower high-frequency or microwave power required for producing the large amounts of fluorine radicals needed.

Further advantages result from the fact that when using interhalogen fluorides as fluorine-delivering etching gases, no sulfur precipitation can occur in the waste gas zone of the etching system, which would otherwise have to be eliminated or suppressed.

Finally, in particular $ClF_3$ and $BrF_3$ are chemically unstable and in air they easily hydrolyze forming HF plus HCl or HBr, respectively, with atmospheric moisture. Therefore, no greenhouse effect occurs with these compounds or gases, so that their industrial availability is guaranteed even long-term from the environmental point of view, which is not unconditionally true for $SF_6$, for example.

$NF_3$, an additive used from time to time in the process gas to consume the passivating material, in particular $SiO_2$ or a teflon-type material, has the advantage over additives based on other available fluorocarbon compounds that considerably stronger stripping of the dielectric layers masking the structure base is achieved, so that it has to be used in considerably smaller amounts in the respective plasma etching process compared to the known additives, with the result that the overall process is less subject to negative effects, in particular dilution of the other active reagents, which otherwise necessarily occurs. The additive may also include a fluoroalkane.

Furthermore, the $NF_3$ additive has a relatively short life in air compared to fluorocarbons ($CHF_3$, $CF_4$, $C_3F_6$, $C_4F_8$, $C_2F_6$, etc.) due to its weaker hydrolysis effect, which also prevents the greenhouse effect from occurring. $NF_3$ reacts with atmospheric moisture even after a short time. In contrast to fluorocarbons which act as greenhouse gases, long-term industrial availability is also ensured in this case.

Addition of a light and easily ionizable gas, i.e., of a gas with a low atomic mass such as He, $H_2$, or Ne, from which slightly positively charged ions are obtained, to the etching gas has the advantage that charging effects, which manifest themselves as interference, in particular at the junctions between electrically conductive silicon and electrically insulating dielectric materials used, for example, as masking materials or buried sacrificial layers, are considerably reduced. Thus considerable improvement in the etching profiles are obtained is achieved, in particular at the junction of silicon with a buried oxide layer, a polymer stop layer, or at the mask edge, i.e., junction of the dielectric masking layer (photoresist or hard material mask made of $SiO_2$) with the silicon to be etched.

This charging effect is based on the fact that negatively charged electrons, which act upon the wafer surface anisotropically, go preferentially to the side walls of the structure to be etched, so that the side walls become negatively charged with respect to the etching base. These electrons move relatively freely within the electrically conductive silicon, while the positively charged ions on the electrically insulating etching base are stationary. Thus, the movable electrons tend to move into the junction region between silicon and the dielectric material, generating a strong electric field there. In the steady-state case these fields on average result in exactly as many ions going to the side walls as there were electrons previously, since they are deflected by the electric fields of a similar strength toward the side wall. This effect is described in the literature as the "notching phenomenon" and results in the formation of large pockets etched into the side wall.

The addition of a light, easily ionizable gas such as He advantageously reduces this formation of pockets considerably.

Another problem caused by electrical charging effects, which is also eliminated by the addition of a light, easily ionizable gas, occurs at the upper mask edge. The surface of a dielectric masking layer on the silicon wafer is negatively charged ("DC bias") by the "self-biasing" effect, often as a result of a high-frequency voltage applied to a conventional substrate electrode.

This charge is caused by the different mobilities of electrons and ions, i.e., in order to draw as many immobile ions as highly mobile electrons to the surface on average over time, a negative electrical bias must be built up there. If silicon is now etched in the openings of a masking layer, this accumulation of surface charges with respect to the newly produced silicon side wall results in concentration of electrons at the silicon to dielectric masking layer junction. Therefore ions are increasingly deflected into this upper part of the etched silicon trench, which also results in the formation of profile irregularities or pockets there. Finally, the addition of a light, easily ionizable gas to the etching gas has the advantage that the side wall film transport mechanism of German Patent No. 42 41 045 is improved in that more polymer is stripped from the etching base and less from the side walls, i.e., selectivity is improved.

Thus, it is believed to be particularly advantageous that the exemplary methods according to the present invention can be combined, with the advantages of the individual methods being preserved. In general, it may be advantageous to also add argon to dilute the etching gas, to the gas forming the passivating material, in particular $SiF_4$, to the additive, or to one of the gases used as a reactant such as oxygen, nitrogen, carbon dioxide, or a nitrogen oxide.

In the mechanisms described above, overall the intensity of the electrical fields required to establish the dynamic equilibrium between the incidence of ions and electrons directly depends on the ease with which the arriving ions can be deflected by electrical fields.

According, relatively heavy ions are only deflected by relatively high-intensity fields, while relatively light ions can be deflected even by relatively low-intensity fields, balancing the charges. By introducing a type of ion with a low atomic mass, it can be achieved to great advantage that only low field intensities are built up in the above-described regions and a sufficient number of these light ions is deflected even with these low field intensities so that they can balance the charges.

The heavy ions occurring in the etching process, for example, as ionized molecules or molecule fragments of the etching gas or additives are no longer deflected by these electrical fields due to their mass and associated inertia, but go directly to the etching base, where they can advantageously promote an etching reaction or etching base polymer stripping, for example. Therefore, the addition of the light, easily ionizable gas results in separation, which is overall very advantageous, between light ions, which balance the charges, and heavy ions, which may affect the etching base.

In addition to the inert gas helium as a light gas, the use of hydrogen ($H_2$) is also advantageous in some plasma etching processes, as long as it is compatible with the process chemistry. The hydrogen molecule in its ionized form has an atomic mass of only 2, and also in plasma it dissociates in a particularly easy manner into positively charged atoms having an atomic mass of 1.

DETAILED DESCRIPTION

An exemplary embodiment is initially based on an anisotropic plasma etching process using a high-density plasma source, for example, an ICP plasma source, an ECR plasma source, or a PIE plasma source as discussed in German Published Patent Application No. 197 06 682.

Instead of the fluorine-delivering etching gas $SF_6$ or $NF_3$ discussed in that patent, however, gaseous chlorine trifluoride $ClF_3$, bromine trifluoride $BrF_3$, or iodine pentafluoride $IF_5$, or a mixture of these gases is added to the process gas as the etching gas in the exemplary embodiment. Chlorine trifluoride or bromine trifluoride, which can be supplied directly via a mass flow controller, may be used, since they have a sufficiently high vapor pressure. When using liquid bromine trifluoride, its temperature may be held above 20° C. in order to convert it into gaseous form. An inert carrier gas, for example, argon, can also be added in an available manner. Helium can also be used instead of argon.

Furthermore, the $SiO_2$-consuming additives discussed in German Patent Published Patent Application No. 197 06 682 ($CHF_3$, $CF_4$, $C_2F_6$, etc.) are replaced by nitrogen trifluoride $NF_3$, which is added to the process gas continuously or at determined intervals. This additive is used in particular for faster removal of the passivating material from the etching base.

The $NF_3$ decomposes under moderate plasma excitation, i.e., typical ICP excitation conditions, into radical fragments $NF_x$ (where x=1, 2), which react in an extremely aggressive manner with dielectric materials and thus act as very effective stripping reagents with respect to $SiO_2$, $SiN$, $SiO_xN_y$ (silicon oxynitride) or teflon-type materials.

The amounts of fluorine released at the same time by the dissociation of $NF_3$ are almost negligible in comparison with the amounts of fluorine from the fluorine-delivering etching gases, for example, $ClF_3$ or $BrF_3$, and also contribute to the silicon etching reaction.

Passivation of the structure side walls in the process is unchanged with respect to that discussed in German Published Patent Application No. 197 06 682 to the addition, at least from time to time, of $SiF_4$ and a reagent selected from the group $O_2$, $N_2O$, $NO$, $NO_x$, $CO_2$, $NO_2$, or $N_2$ to the process gas. Oxygen may be preferred.

Regarding the other process parameters (in particular gas flow rates, process pressures, ion energy, and injected plasma power), reference is made to the respective parameters discussed in German Published Patent Application No. 197 06 682, which can be largely used here.

One composition of the process gas based on the method discussed in German Published Patent Application No. 197 06 682 is given by the following recipe, for example:

60 sccm $ClF_3$+50 sccm $O_2$+50 sccm $SiF_4$+70 sccm He+5 sccm $NF_3$ with constant addition, 20 mTorr pressure, 1000 W high-frequency power at a frequency of 13.56 MHz at the plasma source, 5 W to 20 W high-frequency power at the substrate electrode or:

100 scam $BrF_3$+50 scam $O_2$+50 scam $SiF_4$+70 scam He, plus addition of 30 scam $NF_3$ periodically every 30 to 60 seconds, which may be every 45 seconds over a period of 5 seconds each time, 20 mTorr pressure, 1000 W high-frequency power at the plasma source, 5 W to 30 W high-frequency power at the substrate electrode.

Another exemplary embodiment of the present invention is initially based on a method discussed in German Patent No. 42 41 045. In this known method, anisotropic etching of silicon is performed using a microwave plasma or a plasma generated by an inductive plasma source in particular, anisotropic etching being carried out in separate alternating and successive etching and polymerization/passivation steps, which are controlled separately from one another. During the polymerization steps, a polymer is applied to a lateral structure boundary defined by an etching mask, and this polymer is stripped away again in the subsequent etching steps.

For this purpose, $SF_6$ is added to the process gas, at least from time to time, in particular during the etching steps, as the fluorine-delivering etching gas. During the polymerization steps octafluorocyclobutane $C_4F_8$ or hexafluoropropane $C_3F_6$ is also added to the process gas, in particular in the case of an inductively coupled plasma source, as a passivating gas delivering teflon-forming monomers. This passivating gas forms a teflon-type protective film as a passivating material, in particular on the side walls of the etched structures, protecting them from the etching attack by fluorine radicals.

This method is improved according to the exemplary method of the present invention by the fact that helium in the form of $He^4$ or $He^3$ is also added to the process gas at least from time to time, this addition taking place continuously both during the etching steps and during the passivation steps, since helium as an inert gas in no way affects the process chemistry. The addition of helium guarantees in both steps that undesirable charges are reduced and harmful ion incidence onto the side walls of the etched structures, as explained above, is permanently suppressed or reduced.

As an alternative, the addition of the helium gas can, however, also take place only during the etching steps or only during the polymerization/passivation steps, i.e., the helium flow is added at determined intervals like the etching and passivating gas, helium gas advantageously being used specifically during the etching steps, since, especially in the case of post-etching, buildup of stronger stray fields in the trenches formed must be effectively suppressed even as they are generated. Helium may be added in both process steps continuously at a constant gas flow rate.

A suitable helium gas flow rate may be between 10 and 100 sccm; however, lower or, in particular, higher flow rates are also possible, depending on the suction capacity of the attached turbomolecular vacuum pump of the etching system.

In order to support the stripping of the passivating material from the etching base, $NF_3$ can be used, at least from time to time, in this case too, as a substance to consume the passivating material.

A composition of the process gas in the case of plasma generation via an inductively coupled plasma source (ICP source) is given by the following recipe, for example, based on German Patent 42 41 045:

Passivation Step:
100 sccm $C_3F_6$ or $C_4F_8$+50 sccm He over 5 seconds at 12 mTorr pressure, 800 W high-frequency power at the plasma source, no high-frequency power at the substrate electrode.

Etching Step:
130 sccm $SF_6$+20 sccm $O_2$+50 sccm He over 9 seconds at 20 mTorr pressure, 800 W high-frequency power at the plasma source, 5 W to 20 W high-frequency power at the substrate electrode.

Further exemplary embodiments of the process gas composition, based on the method according to German Patent 42 41 045, are given by the following recipes, in which the fluorine-delivering etching gas $SF_6$ is replaced by $ClF_3$ or $BrF_3$ in the etching steps. Furthermore, $NF_3$ is added, at least from time to time, to the process gas in the etching steps as an additive that may strip the passivating teflon material in particular from the etching base. The process parameters in the passivation steps remain unchanged with respect to the previous example.

Etching Step:
200 sccm $ClF_3$+10 sccm $NF_3$+50 sccm He over 10 seconds at 20 mTorr pressure, 1000 W high-frequency power at the plasma source, 5 W to 20 W high-frequency power at the substrate electrode or:

Etching Step:
200 sccm $ClF_3$+50 sccm He over 10 seconds at 20 mTorr pressure, plus 30 sccm $NF_3$ during the first 3 seconds of the etching steps, 1000 W high-frequency power at the plasma source, 5 W to 20 W high-frequency power at the substrate electrode.

Other recipes use $O_2$ as an alternative to $NF_3$ as the additive for stripping the teflon-type passivating material in particular from the etching base. Oxygen is considerably less aggressive than the $NF_3$ fragments obtained in the plasma; therefore, a considerably higher amount of oxygen must be added, at least from time to time, to the etching gas.

The considerably lower proportion of oxygen added in a previous recipe to $SF_6$ used as an etching gas was used there only for suppressing precipitation of sulfur in the gas waste gas zone. However, such precipitation does not occur when using $ClF_3$ as the etching gas, so that the amount of oxygen added to $ClF_3$, at least temporarily, is available in its entirety for stripping the passivating material, in particular of the etching base. Thus, in the further passivation steps, which are unchanged regarding composition and process parameters, the following advantageous recipe is obtained for the etching steps:

Etching Step:
250 sccm $ClF_3$+50 sccm He over 10 seconds plus 100 sccm $O_2$ during the first 4 seconds, 30 mTorr pressure, 1200 W high-frequency power at the plasma source, 5 W to 30 W high-frequency power at the substrate electrode.

or:

Etching Step:
200 sccm $ClF_3$+50 sccm He+50 sccm $O_2$ over 10 seconds, 30 mTorr pressure, 1000 W high-frequency power at the plasma source, 5 W to 30 W high-frequency power at the substrate electrode.

Regarding the other process parameters, reference is made to the respective parameters in German Patent 42 41 045, which can otherwise be largely retained.

If hydrogen is to be added to the process gas as the light, easily ionizable gas, this addition can be performed on the basis of German Patent 42 41 045 only during the passivation steps. Hydrogen added to the etching gas would react with the released fluorine radicals to form HF, thus neutralizing the latter, i.e., these fluorine radicals would subsequently no longer be available for an etching reaction with silicon. Furthermore, due to the oxygen contained in the etching step, there is a danger of explosion due to the formation of oxyhydrogen gas in the waste gas zone of the etching system. Finally, the hydrogen added must also be taken into account in the passivation chemistry of the passivation step. Since octafluorocyclobutane $C_4F_8$ or hexafluoropropene $C_3F_6$ added from time to time, in particular during the passivation steps, to the process gas as a passivating gas becomes poorer in fluorine by the addition of hydrogen, it is advantageous in this case to replace it with a passivating gas that is richer in fluorine. Perfluoroalcanes such as $C_2F_6$, $C_3F_8$ or, preferably, $C_4F_{10}$ for example, are eminently suitable for this purpose.

Thus not only is excess fluorine bound in the passivation steps via the addition of hydrogen, forming HF, while the desired polymerization effect is achieved, but also sufficient hydrogen is always available for an ionization reaction in order to reduce charging phenomena.

In the case of hydrogen addition to the process gas, suitable process parameters are given by the following recipe, on the basis of a method discussed in German Patent No. 42 41 045; it must be ensured, by appropriate measures in the waste gas zone, that no danger of explosion arises. For this purpose, an available device for catalytic hydrogen conversion is provided between a turbomolecular pump used in the waste gas zone and a vane-type rotary pump, for example.

Passivation Step:

100 sccm $C_4F_{10}$+70 sccm $H_2$ over 5 seconds at 12 mTorr pressure, 800 W high-frequency power at the plasma source, no high-frequency power at the substrate electrode.

Etching Step:

130 scam $SF_6$+20 scam $O_2$ over 9 seconds at 20 mTorr pressure, 800 W high-frequency power at the plasma source, 5 W to 20 W high-frequency power at the substrate electrode.

Another recipe provides, in contrast to the previous unchanged passivation steps, replacement of $SF_6$ as fluorine-delivering etching gas with $BrF_3$, to which $NF_3$ is added, at least from time to time, as an additive for stripping the passivating teflon material in particular from the etching base.

Etching Step:

150 scam $BrF_3$+50 scam Ar or helium (as inert carrier gas)+10 scam $NF_3$ over 10 seconds, 25 mTorr pressure, 1500 W high-frequency power at the plasma source, 5 W to 30 W high-frequency power at the substrate electrode.

By adding helium or hydrogen in order to suppress profile deviations, higher silicon etching rates can also be easily achieved in that the performance parameters of the plasma etching process used, in particular the plasma source power, are scaled up from 800 W to 3000 W, for example.

Finally, selectivity between side wall polymer film stripping and etching base polymer stripping during the etching steps is also improved by the process gas addition according to the present invention, in particular by addition of He or $H_2$, in that etching base polymer stripping is accelerated and side wall polymer film stripping is reduced. This is one result of the deflection of the lighter ions toward the side wall, while heavy ions reach the etching base unimpeded.

The addition of light and easily ionizable gases such as $H_2$, Ne or He is more effective the lower the frequency of the substrate electrode voltage at the substrate electrode, since the lighter ions can follow the variation of the electrical field more easily due to their lower inertia. Applying a high-frequency substrate electrode voltage to the substrate to be etched via a substrate voltage generator (bias power) may be used for accelerating the ions obtained in the plasma onto the substrate.

In the above exemplary embodiment, the frequency of the high-frequency substrate voltage used is reduced for this purpose, for example, from the usual 13.56 MHz to less than 2 MHz. Thus the difference in mass between the lighter gas component and the other components of the etching gas is used to greater advantage.

What is claimed is:

1. A method of anisotropic plasma etching a laterally defined structure in a silicon substrate using a process gas, the method comprising the steps of:

precipitating at least one passivating material on at least a side wall of the laterally defined structure at least one of prior to the anisotropic plasma etching and during the anisotropic plasma etching;

adding at least one fluorine-delivering etching gas to the process gas, the at least one fluorine-delivering etching gas including at least one compound selected from the group consisting of $ClF_3$, $BrF_3$ and $IF_5$;

adding $NF_3$ to the process gas as an additive for consuming the at least one passivating material; and adding a light, easily ionizable gas to the process gas to at least one of improve selectivity, reduce charging effects, increase separation between light ions and heavy ions, and reduce or suppress stray trench fields;

wherein a frequency of a substrate voltage is less than about 2 MHz, so that lighter ions can follow a variation of the electrical field more easily due to their lower inertia.

2. The method of claim 1, further comprising the step of adding at least one gas selected from the group consisting of $SiF_4$, $C_4F_8$, $C_3F_6$, $C_4F_{10}$, $C_3F_8$ and $C_2F_6$ to the process gas as the gas forming the at least one passivating material.

3. The method of claim 1, further comprising the step of adding at least one gas selected from the group consisting of $O_2$, $N_2O$, NO, $NO_x$, $CO_2$, and $NO_2$ to the process gas.

4. The method of claim 1, wherein the light, easily ionizable gas includes at least one of $H_2$, He and Ne.

* * * * *